United States Patent
Ahmed et al.

(10) Patent No.: US 6,797,596 B2
(45) Date of Patent: Sep. 28, 2004

(54) SACRIFICIAL DEPOSITION LAYER AS SCREENING MATERIAL FOR IMPLANTS INTO A WAFER DURING THE MANUFACTURE OF A SEMICONDUCTOR DEVICE

(75) Inventors: Fawad Ahmed, Boise, ID (US); Jigish D. Trivedi, Boise, ID (US); Suraj J Mathew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/232,980

(22) Filed: Aug. 29, 2002

(65) Prior Publication Data

US 2004/0043586 A1 Mar. 4, 2004

(51) Int. Cl.[7] .............................................. H01L 21/425
(52) U.S. Cl. ...................... 438/524; 438/370; 438/510; 438/531; 438/914; 438/923
(58) Field of Search ............................... 438/370, 510, 438/514, 526, 531, 559, 914, 923, 524

(56) References Cited

U.S. PATENT DOCUMENTS

| | | | | |
|---|---|---|---|---|
| 4,669,176 A | * | 6/1987 | Kato | 438/301 |
| 4,843,023 A | * | 6/1989 | Chiu et al. | 438/231 |
| 5,081,516 A | * | 1/1992 | Haskell | 257/384 |
| 5,943,565 A | * | 8/1999 | Ju | 438/231 |
| 6,037,222 A | * | 3/2000 | Huang et al. | 438/257 |
| 6,043,139 A | | 3/2000 | Eaglesham et al. | 438/495 |
| 6,071,797 A | | 6/2000 | Endo et al. | 438/488 |
| 6,489,209 B1 | * | 12/2002 | Shimoji | 438/305 |
| 6,509,223 B2 | * | 1/2003 | Chien et al. | 438/241 |

OTHER PUBLICATIONS

Endo, Kazuhiko et al., "Effect of Bias Addition on the Gap Filling Properties of Fluorinated Armorphous Carbon Thin Films Grown by Helicon Wave Plasma–Enhanced Chemical Vapor Deposition", Jpn. J. Appl. Phys.(35), pp. L1348–L1350, Oct. 15, 1996.

* cited by examiner

*Primary Examiner*—Matthew Smith
*Assistant Examiner*—Renzo Rocchegiani
(74) *Attorney, Agent, or Firm*—Kevin D. Martin

(57) ABSTRACT

A method used during the formation of a semiconductor device reduces ion channeling during implantation of the wafer. The method comprises providing a semiconductor wafer and an unetched transistor gate stack assembly over the wafer. The unetched transistor gate stack assembly comprises a gate oxide layer, a control gate layer, a metal layer, and a dielectric capping layer. A patterned photoresist layer is formed over the unetched transistor gate stack assembly, then each of the capping layer, the metal layer, the control gate layer, and the gate oxide layer is etched to form a plurality of laterally-spaced transistor gate stacks. A screening layer is formed overlying the semiconductor wafer between the transistor gate stacks. A dopant is implanted into the semiconductor wafer through the screening layer, then the screening layer is removed.

29 Claims, 3 Drawing Sheets

SACRIFICIAL DEPOSITION LAYER AS SCREENING MATERIAL FOR IMPLANTS INTO A WAFER DURING THE MANUFACTURE OF A SEMICONDUCTOR DEVICE

FIELD OF THE INVENTION

This invention relates to the field of semiconductor manufacture and, more particularly, to a sacrificial layer used as a screening material during implantation of doping material into active areas of a semiconductor wafer.

BACKGROUND OF THE INVENTION

During the manufacture of semiconductor devices such as memory devices, logic devices, and microprocessors, various process steps are commonly performed. For instance, a semiconductor wafer is commonly oxidized to form a layer of silicon dioxide for various uses such as gate oxide which eventually separates memory array access transistor stacks from the wafer. The wafer is also commonly doped or implanted to increase or decrease its intrinsic electrical conductivity.

FIGS. 1 and 2 depict conventional process steps used during the formation of a semiconductor device. FIG. 1 depicts an unetched transistor gate stack assembly comprising the following structural elements: a semiconductor wafer 10, for example comprising monocrystalline silicon; a gate oxide layer 12 comprising silicon dioxide formed by oxidizing silicon wafer 10; a blanket layer of polycrystalline silicon (polysilicon) 14; a metal layer, for example tungsten silicide 16, which enhances conductivity of polysilicon layer 14; a dielectric capping layer 18; and a patterned photoresist layer 20. After forming the FIG. 1 structure, an etch is performed using the resist as a pattern to result in the structure of FIG. 2, which depicts first and second transistor gate stacks 22. The etch includes etching through the dielectric capping layer 18, the metal layer 16, the polysilicon layer 14, and only partially through gate oxide 12. A portion of oxide 12 remains in the exposed areas between the transistor gate stacks 22, either formed as a result of native oxidation of the silicon wafer if the silicon is exposed during the etch or remaining from an under etch of the gate oxide. This oxide 12 protects the silicon regions not protected from the implant depicted in FIG. 2 by the transistor gate stacks. The implant of FIG. 2 forms doped transistor source and drain regions 24.

The arrangement of silicon atoms within the single crystal structure of the semiconductor wafer forms crystalline lattice channels, or uniform spaces, between adjacent silicon atoms. These channels within the silicon crystal structure provide a path along which implanted ions may travel without encountering silicon atoms to slow their progress. Channeling occurs when dopants enter these channels during implantation, and result in ions traveling either too far into the semiconductor wafer or into undesired locations within the wafer. Channeling makes it difficult to control the electrical properties of the wafer and may lead to device leakage to the substrate or between structures or other adjacent implanted regions, shorting of adjacent structures, or other reduced electrical properties. Instances of channeling are known to decrease with increasing energy, because the ion's direction of travel is less likely to be altered with increased implantation energy. Additionally, channeling decreases with increasing doping concentration (dose), because the crystal structure of the wafer is altered and the channels become less uniform with higher bombardment of ions. Also, channeling decreases with increasing ion size.

One method used to reduce channeling of implanted dopants includes tilting the wafer relative to the direction of the implant. Tilting reduces channeling by implanting ions into the wafer in a number of different directions (off-axis) relative to the direction of the channel in the crystal lattice, and thus the dopants have less likelihood of entering the crystal channels. Tilting the wafer during implantation, however, may result in dopants entering the channel region under the transistor gate stacks. Tilting also requires implanting the wafer in many different directions to ensure complete implantation symmetry for gate stacks of different orientations and to avoid shadowing.

Another method of reducing channeling is to further oxidize the wafer surface subsequent to etching the transistor gate stacks to form a thicker oxide layer between the transistor stacks. Forming this oxide reduces channeling by providing a layer which randomizes the direction of travel of the ions, thereby allowing fewer ions to enter the crystal channels. A drawback to this method is that the oxide forms over the sidewalls of the transistor gate stack by oxidizing the polysilicon gate layer 16. This layer may be subsequently removed using an isotropic etch; however oxidizing the polysilicon gate effectively narrows or "shortens" the transistor gate and increases resistance of the word line, making the implant less self-aligned to the transistor gate edge. Forming a conformal deposited layer over the sidewalls and then implanting the diffusion regions would result in a gap (under-lap) in the implanted region between the edge of the transistor gate and the edge of the diffusion region, thereby resulting in an electrical disconnect between the transistor gate and the diffusion region.

A method and structure for decreasing channeling in semiconductor wafers would be desirable.

SUMMARY OF THE INVENTION

The present invention provides a new method which, among other advantages, reduces problems associated with the manufacture of semiconductor devices, particularly channeling which may occur during ion implantation. In accordance with one embodiment of the invention, a wafer substrate assembly is formed to include a plurality of transistor gate stacks. Subsequently, a screening layer is formed over horizontal surfaces of the wafer assembly, for example over the top of the transistor gate stack capping layers and over horizontal regions between the transistor gate stacks. The screening layer comprises a material having straight-line deposition properties such as a layer of amorphous carbon, or more than one such layer.

After forming the screening layer an implant is performed through the screening layer. As the ions travel through the screening layer they collide with atoms in the screening layer, and thus the direction of ion travel is randomized. This significantly reduces ion channeling by reducing the number of ions which enter channels of the silicon crystal lattice structure of the wafer.

After implanting the wafer through the screening layer, the screening layer is removed, for example using an anisotropic plasma etch. In another embodiment, the screening layer may remain in place during various other processing steps if it has positive effects such as a masking function, or at least if it has no net negative effects. In this instance, a photoresist layer may be formed overlying the screening layer, and may be used to pattern the screening layer for one or more additional etch steps. If the screening layer is not immediately removed after implanting the wafer, it is eventually removed. After removal of the screening layer wafer processing continues according to means known in the art.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE PREFERRED EMBODIMENT

Figure 1:
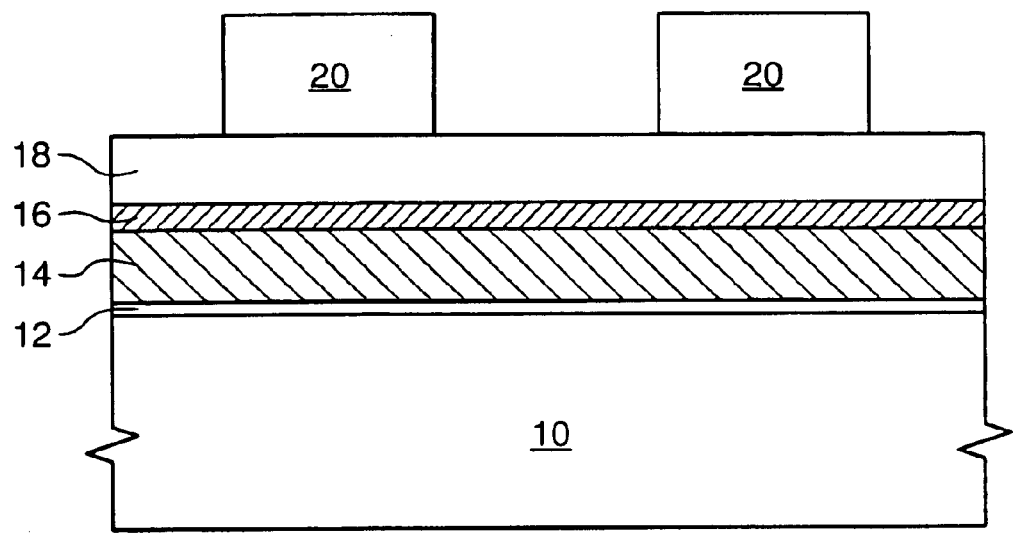
FIG. 1 is a cross section depicting the formation of a plurality of blanket layers of an unetched transistor gate stack assembly, a portion of which will form a transistor gate stack after etching.
Figure 2:
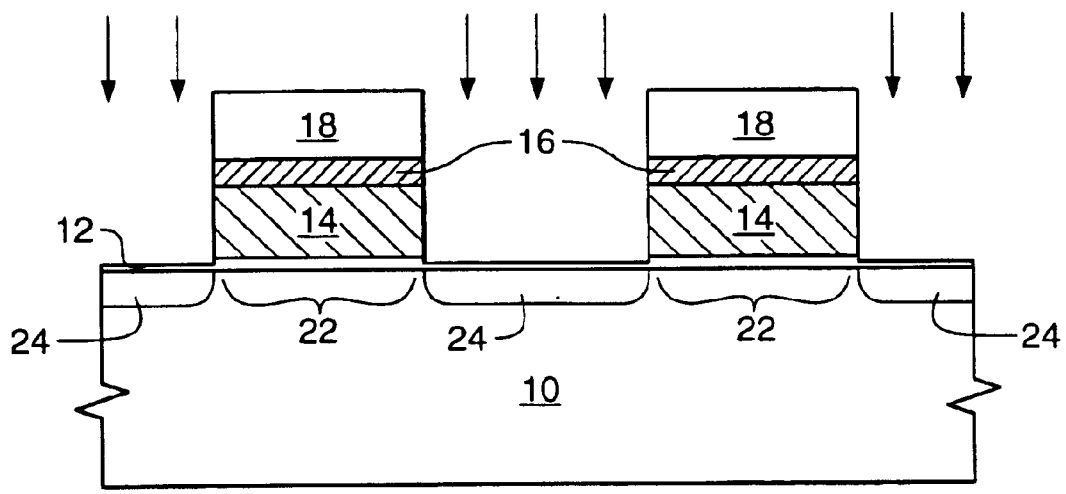
FIG. 2 depicts the structure of FIG. 1 after performing an etch step and during an implantation of ions.
Figure 3:
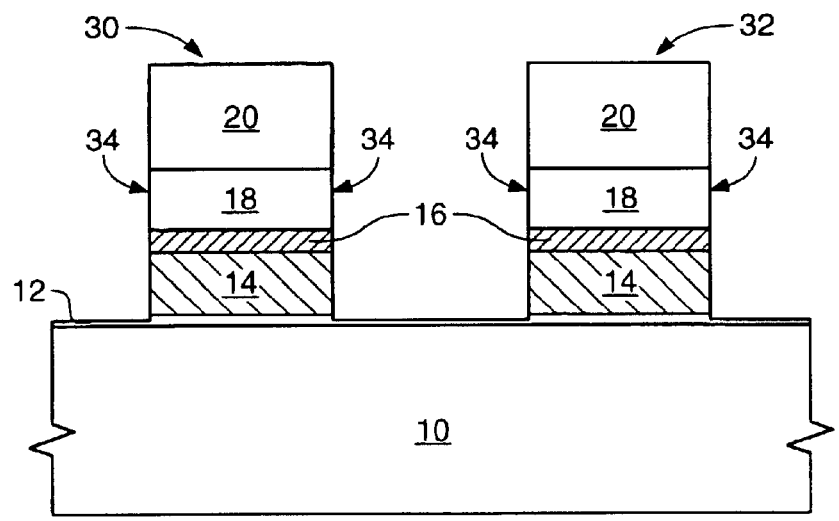
FIG. 3 is a cross section of a portion of a wafer substrate assembly depicting a transistor gate stack to be implanted in an embodiment of the invention.
Figure 4:
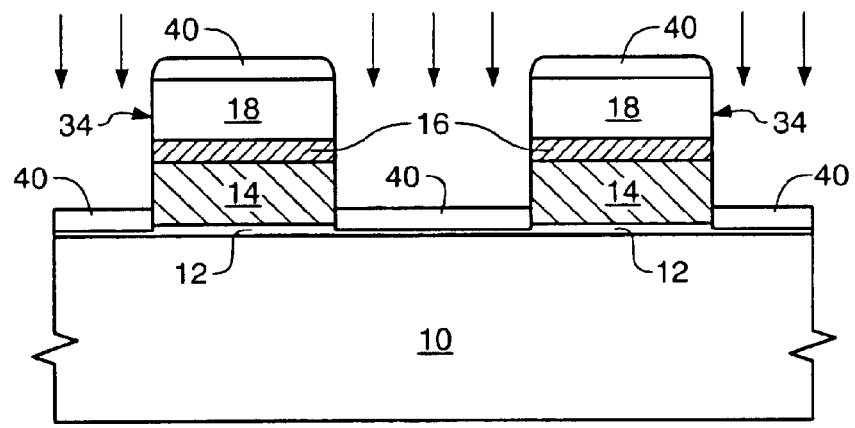
FIG. 4 depicts the structure of FIG. 3 subsequent to the formation of a screening layer and during an implant of a dopant into the wafer through the screening layer in accordance with one embodiment of the invention.
Figure 5:
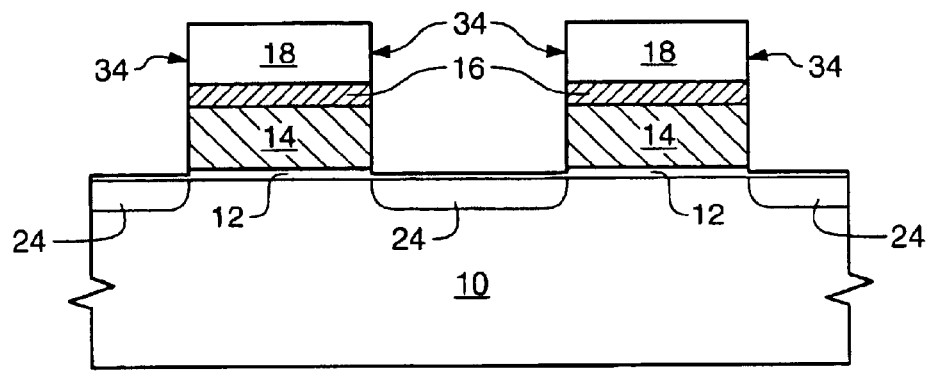
FIG. 5 depicts the FIG. 4 structure subsequent to removal of the screening layer.

An embodiment of an inventive method used in the manufacture of a semiconductor device is depicted in FIGS. 3–5. FIG. 3 depicts the FIG. 1 structure subsequent to an anisotropic etch but prior to a source/drain implant and comprises the following elements: a semiconductor wafer 10, for example a monocrystalline silicon wafer having a crystal lattice structure with crystal channels; gate oxide 12; polysilicon transistor control gates 14; metal gate electrode 16 which enhances the conductivity of polysilicon control gates 14; dielectric capping layer 18, for example silicon nitride; patterned photoresist layer 20 used as a mask during the etch of the blanket layers of FIG. 1; first 30 and second 32 transistor gate stacks; and vertically-oriented sidewalls 34 of the first and second gate stacks. Such a structure as depicted may be manufactured easily by one of ordinary skill in the art from the description herein. The gate oxide 12 between the transistor stacks is etched from an initial pre-etch thickness of between about 45 angstroms (Å) and about 55 Å, preferably about 50 Å, to a post-stack etch thickness of between about 20 Å and about 30 Å. As memory device feature sizes decrease the thickness of the gate oxide also decreases to allow the smaller control gate to have an electrical effect on the channel region. Thus the thickness of the gate oxide between the transistors also decreases, and does not provide an effective screen to randomize the ions during implantation to reduce channeling. While only about 30 Å of gate oxide remains to allow for proper electrical interaction between the transistor gate and the transistor channel region, at least 50 Å of material is desired with conventional processing to reduce channeling of implanted ions.

After forming the FIG. 3 structure the photoresist 20 is removed and a screening material 40 is formed over the surface of the exposed gate oxide 12 and over the exposed capping layer 18. As depicted, a material is preferably selected which has poor step coverage and does not form on vertical surfaces (i.e. a "straight-line" material) such as sidewalls 34, or at least forms minimally on vertical surfaces to minimize the gap formed between the edge of the transistor stack and the implanted region. Thus the sidewalls 34 are substantially free of screening material as they are completely free from screening material or there is insufficient screening material on the sidewalls to adversely affect subsequent processing steps. The screening material is preferably a dense material such that it alters and randomizes the direction of travel of the implanted ions.

A material which would function adequately as a screening layer includes an amorphous carbon layer between about 30 Å and about 500 Å thick, for example about 100 Å thick. Such a layer may be formed using a chemical vapor deposition (CVD) process. For example, propylene ($C_3H_6$) at a flow rate of between about 300 standard cubic centimeters per minute (sccm) and about 1500 sccm, preferably about 600 sccm, and hydrogen ($H_2$) at a flow rate of between about 200 sccm and about 2,000 sccm, preferably about 325 sccm, are introduced into a CVD chamber at a temperature of between about 400° C. and about 650° C., preferably about 550° C. During the introduction of gasses, the CVD chamber is subjected to a power of between about 500 watts and about 1,000 watts, preferably about 785 watts, and a pressure of between about 4.5 Torr and about 8 Torr, preferably about 6 Torr. This process forms an amorphous carbon layer at a rate of about 800 Å per minute to about 1600 Å per minute, depending on the parameter rates used. Another material which may function adequately includes a spun-on glass layer between about 30 Å and about 500 Å thick, for example about 100 Å thick, formed in accordance with means known in the art.

After forming layer 40 an implant is performed as depicted in FIG. 4. A typical lightly doped drain (LDD) implant doses the wafer in exposed areas with boron.

After the implant of FIG. 4, the screening layer 40 is removed by any available means which does not adversely affect other structures or subsequent processing to result in the structure of FIG. 5. If an amorphous carbon layer as described above is used as the screening layer, it may be removed using, for example, a mixture of sulfuric acid ($H_2SO_4$) and hydrogen peroxide ($H_2O_2$), referred to with conventional processing as a "piranha clean." Alternately, the amorphous carbon may be removed using an etchant comprising $NF_3$, He and $O_2$ (20:14:6), for example in an Applied Materials 5000 Etch System, or by using an oxygen plasma ashing process.

Thus with the invention using a screening layer the implant has reduced ion channeling compared with conventional processing, as the ions are randomized such that fewer ions enter the crystal channels in the semiconductor wafer.

In another embodiment, the photoresist 20 of FIG. 3 remains on the dielectric capping layer 18, and the screening layer 40 is formed over the surface of the exposed gate oxide 12 and over the photoresist 20. After implantation of the wafer 10 through the screening layer 40 the photoresist layer 20 and screening layer 40 may be removed with a single step, for example using a mixture of sulfuric acid ($H_2SO_4$) and hydrogen peroxide ($H_2O_2$).

In yet another embodiment, the screening layer remains subsequent to implanting the wafer and is used as a masking layer for additional processing. In this embodiment a photoresist layer can be formed over the screening layer, and the screening layer is patterned using the photoresist layer as a pattern. A feature underlying the screening layer is then etched using the screening layer as a pattern. The screening layer may withstand various etches, for example etch chemistries, better than the photoresist layer, and may therefore have advantages for use as an etch mask. In any case, the screening layer will be removed before wafer processing is completed.

Figure 6:
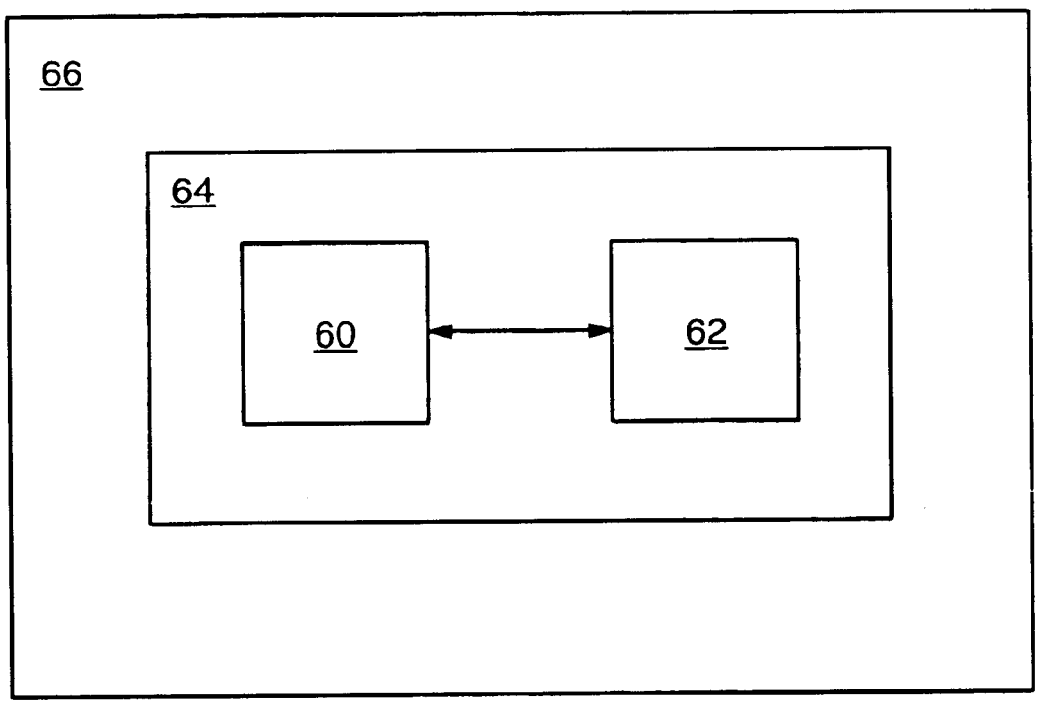
FIG. 6 is a schematic representation depicting a possible use of the invention.

As depicted in FIG. 6, a semiconductor device 60 formed in accordance with the invention may be attached along with other devices such as a microprocessor 62 to a printed circuit board 64, for example to a computer motherboard or as a part of a memory module used in a personal computer, a minicomputer, or a mainframe 66. FIG. 6 may also represent use of device 60 in other electronic devices comprising a housing 66, for example devices comprising a microprocessor 62, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to form a semiconductor device, comprising:
   providing a semiconductor wafer having regions to be implanted;
   providing a plurality of spaced transistor gate stacks over said semiconductor wafer, each gate stack comprising first and second sidewalls and a horizontally-oriented upper portion;
   forming an amorophous carbon sacrificial screening layer over said horizontally-oriented upper portion of each said transistor gate stack and over said wafer regions to be implanted, wherein said first and second sidewalls remain substantially free from said amorphous carbon screening material;
   implanting a dopant through said amorophous carbon sacrificial screening layer into said regions to be implanted; and
   subsequent to implanting said dopant, removing said amorphous carbon sacrificial screening layer.

2. The method of claim 1 further comprising forming the amorphous carbon sacrificial screening layer between about 30 Å and about 500 Å A thick.

3. The method of claim 1 further comprising forming a photoresist layer overlying said screening layer.

4. A method used to form a semiconductor device, comprising:
   providing a semiconductor wafer;
   providing an unetched transistor gate stack assembly over said semiconductor wafer, said unetched transistor gate stack assembly comprising a gate oxide layer, a control gate layer, a metal layer, and a dielectric capping layer;
   forming a patterned photoresist layer over said unetched transistor gate stack assembly;
   etching each of said capping layer, said metal layer, said control gate layer, and said gate oxide layer using said photoresist layer as a pattern to form a plurality of laterally-spaced transistor gate stacks, with each transistor gate stack comprising first and second sidewalls;
   forming an amorphous carbon screening layer overlying said semiconductor wafer between said transistor gate stacks, wherein during said formation of said amorphous carbon screening layer said sidewalls of said transistor gate stacks remain substantially free from said amorphous carbon screening material;
   implanting a dopant into said semiconductor wafer through said amorphous carbon screening layer; and
   subsequent to implanting said dopant, removing said amorphous carbon screening layer.

5. The method of claim 4 further comprising forming the amorphous carbon screening layer between about 30 Å and about 500 Å thick.

6. The method of claim 4 further comprising removing said photoresist layer prior to forming said amorphous carbon screening layer.

7. A method used to form an electronic device, comprising:
   providing a semiconductor device formed by a method comprising:
      providing a semiconductor wafer having regions to be implanted;
      providing a plurality of spaced transistor gate stacks over said semiconductor wafer, each gate stack comprising first and second sidewalls and a horizontally-oriented upper portion;
      forming an amorphous carbon sacrificial screening layer over said horizontally-oriented upper portion of each said transistor gate stack and over said wafer regions to be implanted, wherein said first and second sidewalls remain substantially free from said amorphous carbon screening material;
      implanting a dopant through said amorphous carbon sacrificial screening layer into said regions to be implanted; and
      subsequent to implanting said dopant, removing said amorphous carbon sacrificial screening layer;
   providing an electronic device housing; and
   inserting said semiconductor device into said electronic device housing.

8. The method of claim 7 further comprising forming said amorphous carbon screening layer between about 30 Å and about 500 Å thick during said formation of said amorphous carbon screening layer.

9. An in-process semiconductor device comprising:
   a semiconductor wafer having regions to be implanted;
   a plurality of spaced transistor gate stacks over said semiconductor wafer, each gate stack comprising first and second vertically-oriented sidewalls and a horizontally-oriented upper portion; and
   a sacrificial amorphous carbon implantation screening layer over said horizontally-oriented upper portion of each said transistor gate stack and over said wafer regions to be implanted, wherein said first and second sidewalls remain substantially free from said amorphous carbon screening layer.

10. The device of claim 9 wherein said sacrificial implantation screening layer comprising amorphous carbon is between about 30 Å and about 500 Å thick.

11. The method of claim 9 further comprising a photoresist layer overlying said amorphous carbon screening layer.

12. A method used to form a semiconductor device, comprising:
- providing a semiconductor wafer having regions to be implanted;
- providing a plurality of spaced transistor gate stacks over said semiconductor wafer, each gate stack comprising first and second sidewalls and a horizontally-oriented upper portion;
- forming a spun-on glass sacrificial screening layer over said horizontally-oriented upper portion of each said transistor gate stack and over said wafer regions to be implanted, wherein said first and second sidewalls remain substantially free from said spun-on glass screening material;
- implanting a dopant through said spun-on glass sacrificial screening layer into said regions to be implanted; and
- subsequent to implanting said dopant, removing said spun-on glass sacrificial screening layer.

13. The method of claim 12 further comprising forming the spun-on glass sacrificial screening layer between about 30 Å and about 500 Å thick.

14. The method of claim 12 further comprising forming a photoresist layer overlying said screening layer.

15. A method used to form a semiconductor device, comprising:
- providing a semiconductor wafer;
- providing an unetched transistor gate stack assembly over said semiconductor wafer, said unetched transistor gate stack assembly comprising a gate oxide layer, a control gate layer, a metal layer, and a dielectric capping layer;
- forming a patterned photoresist layer over said unetched transistor gate stack assembly;
- etching each of said capping layer, said metal layer, said control gate layer, and said gate oxide layer using said photoresist layer as a pattern to form a plurality of laterally-spaced transistor gate stacks, with each transistor gate stack comprising first and second sidewalls;
- forming a spun-on glass screening layer overlying said semiconductor wafer between said transistor gate stacks, wherein during said formation of said spun-on glass screening layer said sidewalls of said transistor gate stacks remain substantially free from said spun-on glass screening material;
- implanting a dopant into said semiconductor wafer through said spun-on glass screening layer; and
- subsequent to implanting said dopant, removing said spun-on glass screening layer.

16. The method of claim 15 further comprising forming the spun-on glass screening layer between about 30 Å and about 500 Å thick.

17. The method of claim 15 further comprising removing said photoresist layer prior to forming said spun-on glass screening layer.

18. A method used to form an electronic device, comprising:
- providing a semiconductor device formed by a method comprising:
  - providing a semiconductor wafer having regions to be implanted;
  - providing a plurality of spaced transistor gate stacks over said semiconductor wafer, each gate stack comprising first and second sidewalls and a horizontally-oriented upper portion;
  - forming a spun-on glass sacrificial screening layer over said horizontally-oriented upper portion of each said transistor gate stack and over said wafer regions to be implanted, wherein said first and second sidewalls remain substantially free from said spun-on glass screening material;
  - implanting a dopant through said spun-on glass sacrificial screening layer into said regions to be implanted; and
  - subsequent to implanting said dopant, removing said spun-on glass sacrificial screening layer;
- providing an electronic device housing; and
- inserting said semiconductor device into said electronic device housing.

19. The method of claim 18 further comprising forming said spun-on glass screening layer between about 30 Å and about 500 Å thick during said formation of said spun-on glass screening layer.

20. An in-process semiconductor device comprising:
- a semiconductor wafer having regions to be implanted;
- a plurality of spaced transistor gate stacks over said semiconductor wafer, each gate stack comprising first and second vertically-oriented sidewalls and a horizontally-oriented upper portion; and
- a sacrificial spun-on glass implantation screening layer over said horizontally-oriented upper portion of each said transistor gate stack and over said wafer regions to be implanted, wherein said first and second sidewalls remain substantially free from said spun-on glass screening layer.

21. The device of claim 20 wherein said sacrificial implantation screening layer comprising spun-on glass is between about 30 Å and about 500 Å thick.

22. The method of claim 20 further comprising a photoresist layer overlying said spun-on glass screening layer.

23. A method used to form a semiconductor device, comprising:
- providing a semiconductor wafer having regions to be implanted;
- providing a plurality of spaced transistor gate stacks over said semiconductor wafer, each gate stack comprising first and second vertically-oriented sidewalls comprising an exposed conductive portion and a horizontally-oriented upper portion;
- while said conductive portions of said gate stacks are exposed, forming a sacrificial screening layer from a straight-line material over said horizontally-oriented upper portion of each said transistor gate stack and over said wafer regions to be implanted, wherein said straight-line screening layer does not form on said exposed conductive portions of said first and second sidewalls;
- implanting a dopant through said sacrificial screening layer into said regions to be implanted; and
- subsequent to implanting said dopant, removing said sacrificial screening layer.

24. The method of claim 23 further comprising forming the sacrificial screening layer between about 30 Å and about 500 Å thick.

25. The method of claim 23 further comprising forming a photoresist layer overlying said screening layer.

26. A method used to form an electronic device, comprising:
- providing a semiconductor device formed by a method comprising:
  - providing a semiconductor wafer having regions to be implanted;

providing a plurality of spaced transistor gate stacks over said semiconductor wafer, each gate stack comprising a horizontally-oriented upper portion and first and second vertically-oriented sidewalls, with each vertically-oriented sidewall comprising an exposed conductive portion;

while said conductive portions of said vertically-oriented sidewalls are exposed, forming a sacrificial screening layer from a straight-line material over said horizontally-oriented upper portion of each said transistor gate stack and over said wafer regions to be implanted, wherein said exposed conductive portions of said first and second sidewalls remain substantially free from said straight-line screening material;

implanting a dopant through said straight-line sacrificial screening layer into said regions to be implanted; and subsequent to implanting said dopant, removing said straight-line sacrificial screening layer;

providing an electronic device housing; and inserting said semiconductor device into said electronic device housing.

27. An in-process semiconductor device comprising:

a semiconductor wafer having regions to be implanted;

a plurality of spaced transistor gate stacks over said semiconductor wafer, each gate stack comprising first and second vertically-oriented sidewalls and a horizontally-oriented upper portion, wherein said vertically-oriented sidewalls each comprise an exposed conductive portion; and a sacrificial implantation screening layer formed from a straight-line material over said horizontally-oriented upper portion of each said transistor gate stack and over said wafer regions to be implanted, wherein said exposed conductive portions of said vertically-oriented sidewalls remain substantially free from said straight-line screening layer.

28. The device of claim 27 wherein said sacrificial implantation screening layer comprising spun-on glass is between about 30 Å and about 500 Å thick.

29. The method of claim 27 further comprising a photoresist layer overlying said spun-on glass screening layer.

* * * * *